United States Patent
Yoon et al.

(10) Patent No.: US 10,574,207 B2
(45) Date of Patent: Feb. 25, 2020

(54) ELECTROACOUSTIC TRANSDUCER WITH IMPROVED SUPPRESSION OF UNWANTED MODES

(71) Applicant: SNAPTRACK, INC., San Diego, CA (US)

(72) Inventors: Jiman Yoon, Augsburg (DE); Philipp Michael Jäger, München (DE)

(73) Assignee: SnapTrack, Inc., San Diego, CA (US)

( * ) Notice: Subject to any disclaimer, the term of this patent is extended or adjusted under 35 U.S.C. 154(b) by 280 days.

(21) Appl. No.: 15/531,299

(22) PCT Filed: Dec. 16, 2014

(86) PCT No.: PCT/EP2014/077974
§ 371 (c)(1),
(2) Date: May 26, 2017

(87) PCT Pub. No.: WO2016/095967
PCT Pub. Date: Jun. 23, 2016

(65) Prior Publication Data
US 2017/0331451 A1    Nov. 16, 2017

(51) Int. Cl.
*H03H 9/02* (2006.01)
*H03H 9/145* (2006.01)

(52) U.S. Cl.
CPC .... *H03H 9/02559* (2013.01); *H03H 9/02551* (2013.01); *H03H 9/14544* (2013.01)

(58) Field of Classification Search
CPC .......... H03H 9/02559; H03H 9/02535; H03H 9/02551; H03H 9/02858

USPC ...... 310/313 R, 313 A, 313 B, 313 C, 313 D
See application file for complete search history.

(56) References Cited

U.S. PATENT DOCUMENTS

| | | | |
|---|---|---|---|
| 7,939,987 B1 | 5/2011 | Solal et al. | |
| 2011/0068655 A1 | 3/2011 | Solal et al. | |
| 2013/0051588 A1* | 2/2013 | Ruile | H03H 3/08 |
| | | | 381/190 |
| 2014/0001919 A1 | 1/2014 | Komatsu et al. | |

FOREIGN PATENT DOCUMENTS

| | | |
|---|---|---|
| JP | H09260993 | 10/1997 |
| JP | H1032463 A | 2/1998 |
| JP | 2011101350 A | 5/2011 |
| JP | 2013544041 A | 12/2013 |
| WO | WO-2012132238 A1 | 10/2012 |

(Continued)

OTHER PUBLICATIONS

International Search Report and Written Opinion—PCT/EP2014/077974—ISA/EPO—Aug. 21, 2015.

(Continued)

*Primary Examiner* — Derek J Rosenau
(74) *Attorney, Agent, or Firm* — Patterson & Sheridan, LLP

(57) ABSTRACT

An improved electroacoustic transducer with an improved mode profile is provided. The transducer comprises a transversal velocity profile with a periodic structure and an edge structure flanking the periodic structure. The velocity profile also allows to suppress the SH wave mode. A dielectric material with a periodic structure contributes to the formation of the periodic structure of the velocity profile.

18 Claims, 13 Drawing Sheets

(56) References Cited

FOREIGN PATENT DOCUMENTS

WO    2014192756 A1    12/2014

OTHER PUBLICATIONS

Yoon J., et al., "Mode Profile Shaping with 20 Periodic Array of Metallic Patches on Electrodes in SAW Resonators", 2013 European Microwave Conference, European Microwave Association, Oct. 6, 2013 (Oct. 6, 2013), XP032535472, pp. 1227-1230, [retrieved on Dec. 17, 2013].

\* cited by examiner

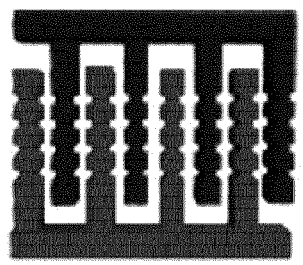
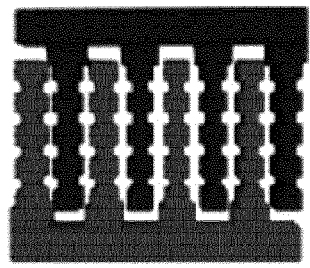
Fig. 13
Fig. 14
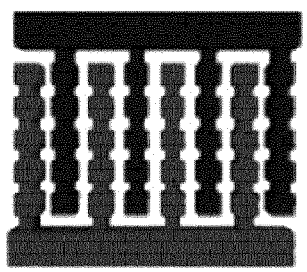
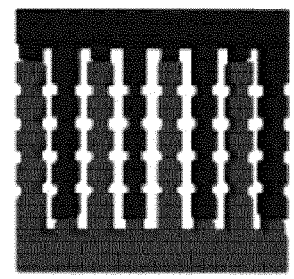
Fig. 15
Fig. 16
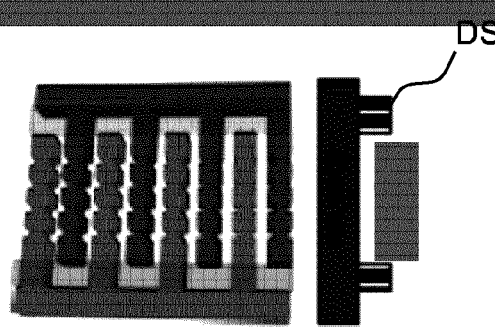
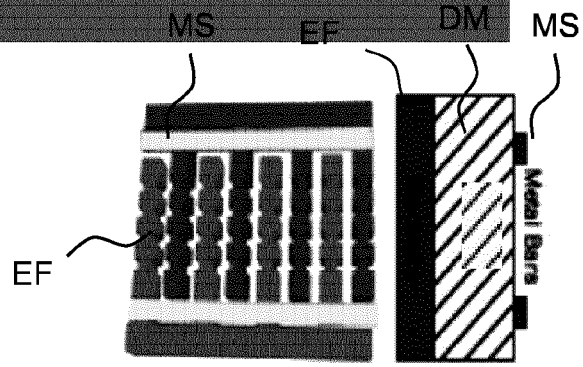
Fig. 17
Fig. 18
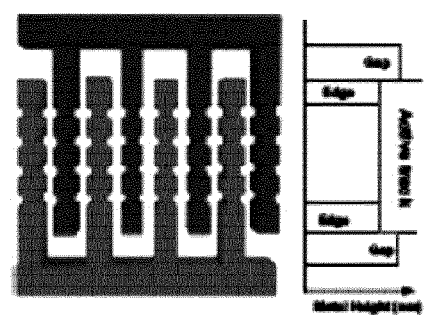
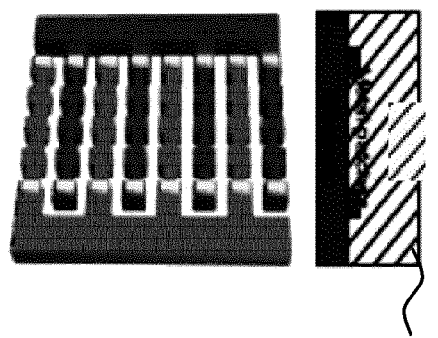
Fig. 19
Fig. 20

ELECTROACOUSTIC TRANSDUCER WITH IMPROVED SUPPRESSION OF UNWANTED MODES

The present invention refers to electroacoustic transducers with improved profiles of the acoustical wave mode.

Electroacoustic transducers may be used in RF filters working with acoustical waves. An according filter can comprise one or more electroacoustic resonators in one or more acoustic tracks. The resonators comprise transducers with interdigitating electrode fingers, each of which is connected to one of two busbars of the transducer. Utilizing the piezoelectric effect the transducer converts an electromagnetic RF signal into acoustic waves and vice versa.

Possible implementations of electroacoustic transducers are SAW transducers (SAW=Surface Acoustic Wave) or GBAW transducers (GBAW=Guided Bulk Acoustic Wave).

If unwanted wave modes are not suppressed in resonators the electrical properties of respective RF filters are deteriorated.

From EP 1 871 006 A1 and from EP 1 962 424 A1 SAW transducers are known. Aperture weighting is used to suppress unwanted transversal modes.

From U.S. Pat. No. 7,576,471 B1, US 2013/051588 A1 and from U.S. Pat. No. 7,538,637 B2 transducers operating in a piston mode are known to suppress unwanted transversal modes.

From U.S. Pat. No. 7,939,987 B1 further means such as two dimensional reflectors are known to suppress transversal modes.

From the article "Two Dimensional Periodic Array of Reflection Centers on Electrodes in SAW Resonators" (Ji-man Yoon et al., Ultrasonic Symposium, 2012, IEEE, October 2012, p. 1798-1801) means for shaping the fundamental mode in a transducer are known.

It is, thus, an object to provide an electroacoustic transducer allows improved electrical properties of respective filters. In particular, it is an object to provide a transducer with an improved piston mode.

For this purpose, electroacoustic transducers according to the independent claims are provided. The dependent claims provide preferred embodiments of the invention.

Two transducers schemes are presented: One for transducers with $LiNbO_3$ as the piezoelectric material and one for transducers with $LiTaO_3$ as the piezoelectric material.

An electroacoustic transducer with $LiNbO_3$ as the piezoelectric material comprises a longitudinal direction and a transversal direction orthogonal to the longitudinal direction. The longitudinal direction defines the main propagation direction of the acoustic waves. The transversal direction mainly defines the orientation of interdigitated electrode fingers of the transducer.

The transducer further comprises a transversal velocity profile of acoustic waves propagating in the transducer and an acoustically active region. The acoustically active region is mainly defined as the overlap region of electrode fingers of opposite polarity, i.e. as the area in which acoustic waves propagating in the longitudinal direction are excited when an RF signal is applied to the transducer.

The transducer further comprises a periodic dielectric material in the active region having a periodic structure along the transversal direction.

The transversal velocity profile has a periodic structure in this active region. The periodic dielectric material contributes to the formation of the shape of the periodic structure of the velocity profile. The periodic structure has a plurality of minimal values and a plurality of maximal values larger than the minimal values. Further, the periodic structure is flanked on both sides by an edge structure of the transversal velocity profile. The velocity in the edge structure is lower than the maximal values of the periodic structure.

It is possible that the periodic structure has two outermost sections with a maximum velocity.

I.e. there are two stripes of a lower velocity per unit cell arranged next to the periodic structure within the active region. Here, the unit cell denotes a segment of the acoustic track with a length in the longitudinal direction of the acoustic wavelength $\lambda$.

Possible crystal cuts for $LiNbO_3$ are the conventional LN RY-X cuts.

An electroacoustic transducer with $LiTaO_3$ as the piezoelectric material comprises a longitudinal direction and a transversal direction orthogonal to the longitudinal direction. The longitudinal direction defines the main propagation direction of the acoustic waves. The transversal direction mainly defines the orientation of electrode fingers of the transducer.

The transducer further comprises a transversal velocity profile of acoustic waves propagating in the transducer and an acoustically active region. The acoustically active region is mainly defined as the overlap region of the interdigitating electrode fingers of opposite polarity, i.e. as the area in which acoustic waves propagating in the longitudinal direction are excited when an RF signal is applied to the transducer.

The transducer further comprises a periodic dielectric material in the active region having a periodic structure along the transversal direction.

The transversal velocity profile has a periodic structure in this active region. The periodic dielectric material contributes to the formation of the shape of the periodic structure of the velocity profile. The periodic structure has a plurality of minimal values and a plurality of maximal values larger than the minimal values. Further, the periodic structure is flanked on both sides by an edge structure of the transversal velocity profile. The velocity in the edge structure is higher than the minimal values of the periodic structure.

Possible crystal cuts to $LiTaO_3$ are: LT 36 . . . 46RY-X.

Other piezoelectric materials such as quartz, langasite crystals, langanite crystals, langatate crystals, AlN, ZnO, $KNbO_3$, $NaNbO_3$, $GaPO_4$, $Li_2B_4O_7$ are also possible.

It is also possible that the piezoelectric material comprises other composites of the respective crystallographic families.

The use of a dielectric material as a material for setting the local wave velocity has less effects on the electrical properties of the transducer. In particular, stray capacities are reduced compared to a conducting material like a metal. However, the wide range of densities of metals (e.g. up to the density of Gold) cannot be obtained with a dielectric material.

Especially in transducers with $LiTaO_3$ being the piezoelectric substrate the presence of dummy fingers may be preferred.

Depending on the substrate's material and the cut angle it might be beneficial to use dummy fingers, especially for LT 36 . . . 46 substrates.

It is possible that the shape of the periodic dielectric material coincides with the periodic structure of the velocity profile. This may be the case if a segment of the periodic dielectric material has an additional mass and locally reduces the acoustic velocity or if a section of the periodic dielectric material having higher stiffness parameters increases the acoustic velocity. Then, the segment of the periodic dielectric material and the segment with reduced/increased velocity share the same place of the transducer.

The relation between mass/density (p), stiffness (c) and velocity (v) is: v=sqrt (c/p).

It is possible that the periodic dielectric material is the only reason for the periodic velocity profile. However, other means such as a locally increased finger thickness/metallization ration η or sections of the electrode fingers with different stiffness or density and the presence of the periodic dielectric material can work together to form the shape of the velocity profile.

It is possible that the periodic dielectric material is structured from a passivation layer, a structured material from a TCF-compensation layer (TCF: Temperature Coefficients of Frequency) or an additional structured material with the only purpose of forming the shape of the velocity profile.

Thus, it is possible that the periodic dielectric material (PDM) is arranged directly on the electrode fingers, in a passivation layer deposited above the electrode fingers, in a TCF-compensation layer deposited above the electrode fingers or on the top side of the transducer.

It is possible that the periodic dielectric material comprises stripes arranged on the electrode fingers.

It is possible that the periodic dielectric material comprises stripes arranged above the electrode fingers.

The stripes can have a quadratic or a rectangular shape. However, circles and an ellipsoid shape is also possible.

It is possible that the periodic dielectric material comprises stripes arranged between the electrode fingers or elevated over center positions between electrode fingers.

It is possible that the periodic dielectric material comprises stripes extending along the longitudinal direction. The length of the stripes may equal the length of the acoustic track or of the transducer.

It is possible that the periodic dielectric material has a density different from a density of dielectric material surrounding the periodic dielectric material. It is also possible that the periodic dielectric material has a stiffness different from a stiffness of dielectric material or metal surrounding the periodic dielectric material.

The stiffness parameters and the density of the dielectric material having the periodic structure are quantities that can be used to affect a wave's velocity. Thus, by chosing an appropriate material at a specific location the velocity profile can be adjusted to match a profil optimized for its wave guiding properties.

The periodic structure of the velocity profile may have a difference in velocity of approx. 30 m/s to 200 m/s between the lowest velocity and the highest velocity. A velocity difference of approx. 100 m/s may be preferred. High velocity differences may result in the need for narrow edge regions between the transducer's electrodes.

The passivation layer may comprise silicon dioxide, $Al_2O_3$, AlN, $Si_3N_4$ or similar dielectric materials.

The periodic dielectric material can comprise $Ta_2O_5$, $Nb_2O_5$, HfO, $Al_2O_3$, AlN, $Si_3N_4$, $GeO_2$, $SiO_2$ or similar dielectric materials.

A TCF compensation layer can comprise $SiO_2$ and doped $SiO_2$. The $SiO_2$ can be doped by F (fluorine), B (Boron), Ti (Titanium).

It is possible that the periodic structure has two outermost sections with a minimum velocity.

I.e. there are two stripes of a higher velocity in each unit cell arranged next to the periodic structure within the active region.

The two stripes per unit cell can extend over the length of the transducer resulting in a total number of two stripes per transducer.

The velocity profile can be a Δv/v waveguide. I.e. the periodic structure can be a part of Δv/v waveguide.

The periodic structure and the edge structure establish a region of stripes of chosen velocity values extending in the longitudinal direction.

The wording "periodic structure" denotes the shape of the velocity profile in the transversal direction. In the periodic structure the velocity profile, thus, comprises identical sections of higher and lower velocity being arranged next to one another and extending in the transversal direction.

The periodic structure can consist of a sinusoidal structure, a saw tooth structure, a square-wave structure. However, the periodic structure can be built-up of a combination of these structures.

It is possible that the periodic structure has a periodicity in the periodic length but the amplitude of minimum and maximum velocity values follow a profile, e.g. a parabola, sine function or a cosine function.

It was found that the combination of the periodic structure and the edge structure define a velocity profile in the active region of a transducer in which not only unwanted transversal modes. This is surprising as conventional means only can suppress one of two or more unwanted modes, i.e., only unwanted transversal modes, and reduce the efficiency of the transducer.

In one embodiment the edge structure comprises two stripes per unit cell being arranged directly next to a respective side of the periodic structure. Thus, the edge structure directly flanks the periodic structure with no other section in between.

In principle, the length of the edge structure is not limited to the periodic length of the periodic structure. The length can be larger than the periodic length or smaller than the periodic length. However, in one embodiment, especially working with $LiNbO_3$ as the piezoelectric material, the edge structure has a length 1 being larger than 50% of a period, i.e. the periodic length, of the periodic structure.

If an absolute value of the periodic length of the periodic structure is larger than 8 μm and if a longitudinal pitch is larger than 2 μm then the edge length is preferred to be smaller than the periodic length of the periodic structure.

In one embodiment, especially working with $LiTaO_3$ as the piezoelectric material, the edge structure has a length 1 being smaller than 50% of a period, i.e. the periodic length, of the periodic structure.

The phrase "length" when referred to the transducer itself means the extension in the longitudinal direction. The phrase "width" when referred to the transducer itself means the extension in the transversal direction.

The phrase "length" when referred to an electrode finger or to the velocity profile means the extension in the transversal direction. The phrase "width" when referred to an electrode finger or to the velocity profile means the extension in the longitudinal direction.

In one embodiment the transducer further comprises one stripe of a gap structure per unit cell flanking the edge structure. the number of electrode fingers per unit cell In the acoustically active region is twice the number of the electrode fingers in the gap region. Thus, only one stripe of the gap structure exists in each unit cell. In the gap structure the velocity is larger than the maximal value of the periodic structure. The active region is arranged between the longitudinal sections of the gap structure, i.e. the gap structure is not a part of the active region.

It is possible that the gap structure corresponds to an area of piezoelectric material of the transducer where the ends of electrode fingers of one polarity oppose elements, e.g. the busbar itself or dummy fingers connected to the busbar, of the respective other electrode.

In one embodiment the gap structure's stripes have a length from $0.5\lambda$ to $10\lambda$ or, especially, from $2\lambda$ to $4\lambda$. Here, the phrase "length" denotes the extension along the transversal direction.

Here, $\lambda$ denotes the wavelength of the wanted acoustic waves propagating in the longitudinal direction. The wavelength $\lambda$ is mainly defined by the periodic length of the finger structure, e.g. of the average periodic length, of the transducer.

The gap structure can be flanked by structures of reduced velocity. The reduction of the velocity may be caused by an increase of the finger width or by the mass loading which may be achieved by an additional metal layer.

In one embodiment the gap structure has a metallization ratio $\eta$ between 0.2 and 0.8. The metallization ratio $\eta$ is defined as $$\eta = (w_1 + w_2 + \ldots + w_n)/\lambda$$

where $w_i$ denotes the width of the i-th electrode finger of electrode fingers within a distance of length $\lambda$ along the longitudinal direction. In a conventional transducer in the active region n equals 2. In a splitfinger transducer n may equal 4. In the region of the acoustic track corresponding to the gap structure only electrode fingers of one polarity may be present. Thus, n may equal 1.

In one embodiment the transducer comprises a piezoelectric substrate, two busbars arranged on the substrate and aligned parallel to the longitudinal direction and interdigitated electrode fingers. The fingers are arranged on the substrate, connected to one of the busbars, and aligned parallel to the transversal direction.

The overlap of fingers of opposite polarity defines the active region.

The presence of the electrode fingers on the substrate establish a convenient way to shape the velocity profile: With the mass of the fingers, the fingers acoustic impedance and electric resistivity details of the wave propagation, especially the wave velocity, can be manipulated. Increasing the mass loading of the substrate at a place of the substrate—e.g. via material of the electrode structure of the busbars and electrode fingers—mainly leads to a decrease of the wave velocity. Increasing the stiffness parameters of the acoustic track—e.g. via a material with a high Young's Modulus—mainly leads to an increase of the velocity.

In one embodiment, accordingly, the transversal velocity profile is adjusted via one or more measures selected from:
reduced velocity by increased mass loading by increased finger width,
reduced velocity by increased mass loading by increased finger thickness,
reduced velocity by increased mass loading by additional material deposited on the electrode fingers,
reduced velocity in the gap region by increased mass loading by dummy patches in the gap region,
reduced velocity by increased mass loading by material deposited in stripes on the electrode fingers,
increased velocity by reduced mass loading by reduced finger width,
increased velocity by reduced mass loading by reduced finger thickness,
increased velocity by reduced mass loading by material removed from the electrode fingers.

The metallization ratio $\eta$ in regions of a lower velocity can be in the range from 0.3 to 0.8. Values between 0.4 and 0.75 may be preferred.

The metallization ratio $\eta$ in regions of a higher velocity can be in the range from 0.15 to 0.75. Values between 0.2 and 0.6 may be preferred.

The periodic length in the periodic structure can be in the range from $0.2$ to $3\lambda$, $\lambda$ being the acoustic wavelength (in the longitudinal direction).

The ratio between the length of the higher velocity divided by the periodic length can be in the range from 0.2 to 0.8. A ratio between 0.4 and 0.6 may be preferred.

For $LiNbO_3$ substrates the following is true: The length of the sections of the edge structure may be in the range from $0.05\lambda$ to $5\lambda$. Lengths between $0.2\lambda$ and $3\lambda$ may be preferred depending on the frequency of the transducer.

For $LiTaO_3$ substrates the following is true: The length of the sections of the edge structure may be in the range from $0.1\lambda$ to $1\lambda$. Lengths between $0.2\lambda$ and $0.7\lambda$ may be preferred.

It is possible that the transversal velocity profile comprises further periodic or aperiodic or symmetric or asymmetric structure. However, it is also possible that the transversal velocity profile in the acoustic track consists of the above mentioned structures.

With a transducer as described above the normalized overlap integral $<\Phi/\Psi_n>$ for the fundamental mode n=1 can be in the range of 0.95 or above. As the overlap integral describes the match between the (normalized) excitation function $\Phi$ and the (normalized) wave mode shape $\Psi_n$ and as the different modes $\Psi_n$ are orthogonal a value just below 1 prevents higher modes to be excited.

BRIEF DESCRIPTION OF THE FIGURES

The transducer is explained in greater detail on the basis of exemplary and not limiting embodiments and associated figures below.

FIG. 13 shows an embodiment of a transducer's electrode structure.

FIG. 14 shows another embodiment of an electrode structure having an increased finger width in a region corresponding to the gap structure.

FIG. 15 shows an embodiment of electrode structures having a reduced finger width in the region corresponding to the gap structure.

FIG. 16 shows an embodiment of electrode structures comprising dummy finger patches arranged within the region corresponding to the gap structure.

FIG. 17 shows stripes comprising a dielectric material arranged in the region corresponding to the gap structure.

FIG. 18 shows an embodiment of electrode structures comprising metal bars arranged on a dielectric material arranged on the electrode fingers and the bus bars.

FIG. 19 shows an embodiment of a transducer structure where material is removed in the active region to reduce the mass loading.

FIG. 20 shows an embodiment of a transducer structure with individual additional masses arranged on each side of the electrode fingers to increase the mass loading.

DETAILED DESCRIPTION

Figure 1:
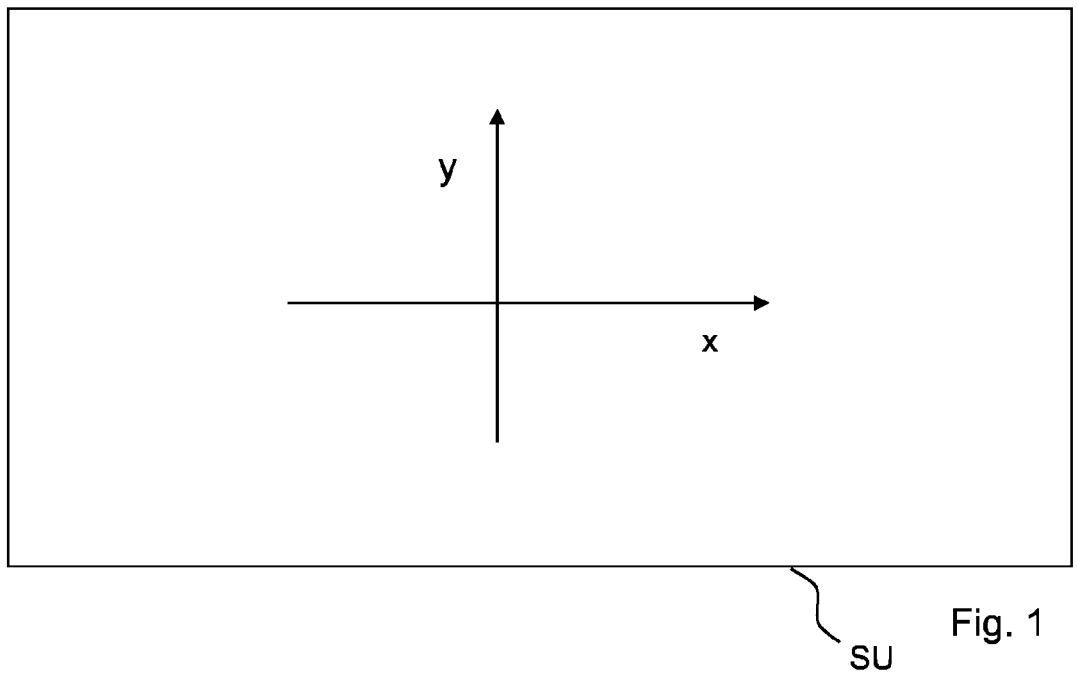
FIG. 1 shows the orientation of the longitudinal direction x with respect to the transversal direction y.

FIG. 1 shows a substrate SU which may comprise piezoelectric material such as lithium niobate ($LiNbO_3$) or lithium tantalate ($LiTaO_3$). x denotes the longitudinal direction. y denotes the transversal direction. Interdigital transducers are arranged in such a way that the main direction of propagation is parallel to the x-direction. Accordingly, a crystal cut of the substrate SU is chosen to obtain a high coupling coefficient.

Figure 2:
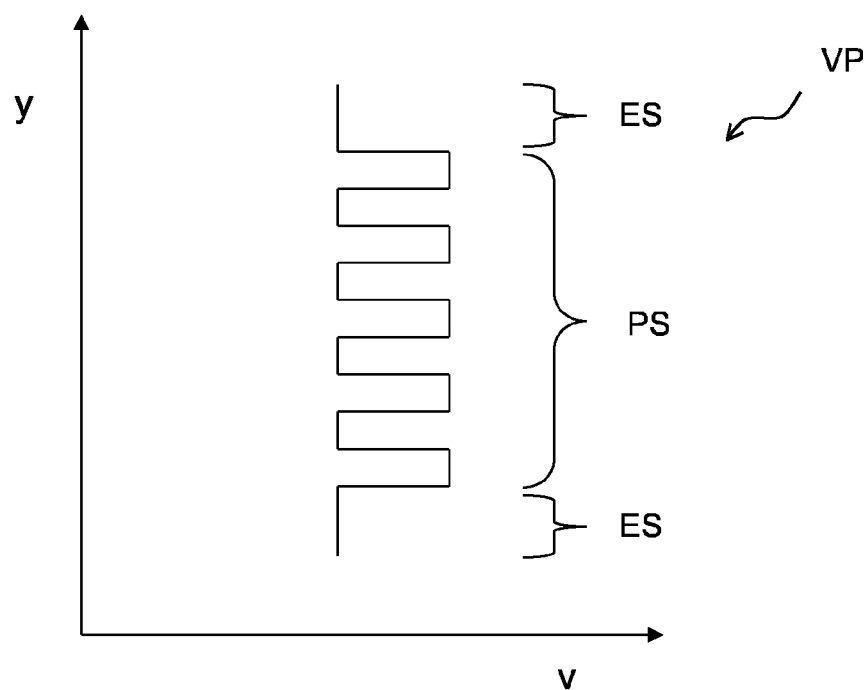
FIG. 2 shows the transversal velocity profile v along the transversal direction y.

FIG. 2 illustrates the velocity profile VP of acoustic waves propagating in the substrate SU shown in FIG. 1. The velocity profile has a periodic structure PS which is flanked by edge structures ES in such a way that the periodic structure PS is arranged between the edge structures ES in the transversal direction y. The periodic structure PS comprises areas with a relative high velocity v and areas with a relative low velocity. The areas of high and low velocity alternate in such a way that a periodic velocity profile in the periodic structure is obtained. The velocity in the edge structure is lower than the maximum velocity in the periodic structure PS.

The velocity in the edge structure may be equal to the lowest velocity in the periodic structure. However, the velocity in the edge structure ES may differ from the lowest velocity in the periodic structure. Also, the length of the edge structure is not limited. However, it may be preferred that the length of the respective stripe of the edge structure ES is larger than half of the periodic length of the periodic structure PS. Here the phrase "length" denotes the extension of the edge structure in the transversal direction.

Figure 3:
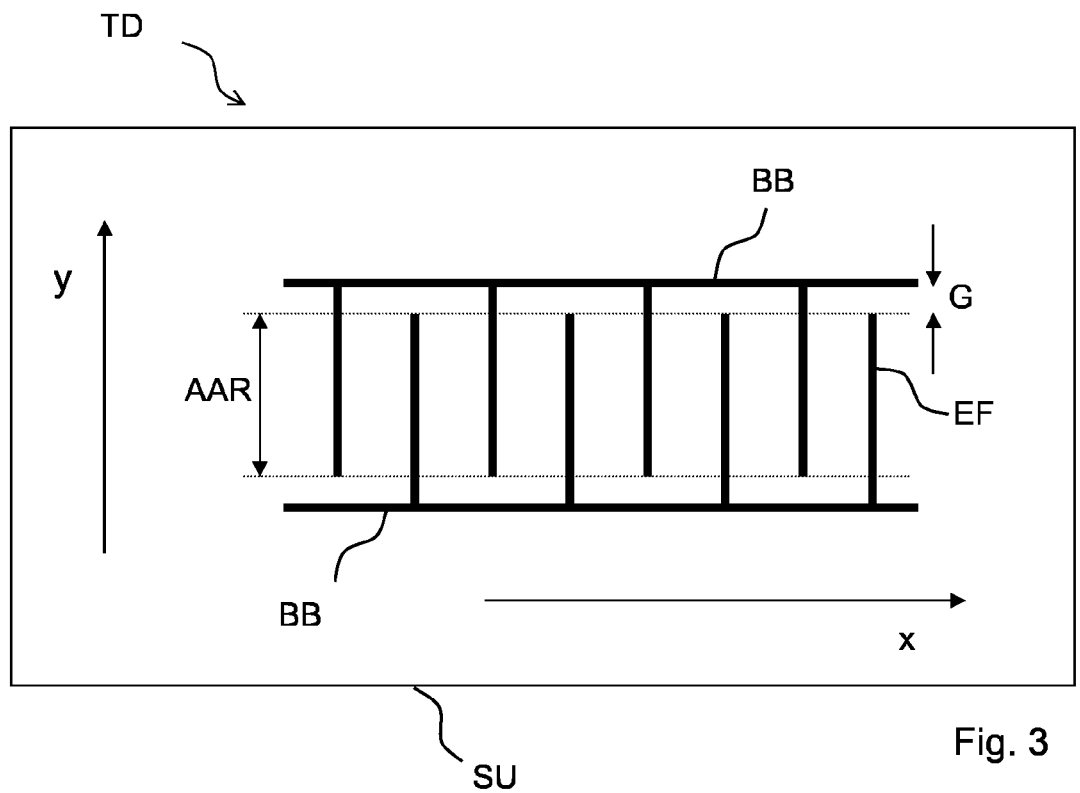
FIG. 3 shows the orientation of the transducer with respect to the longitudinal direction x and the transversal direction y.

FIG. 3 shows the orientation of the transducer TD comprising bus bars BB and electrode fingers EF with respect to the longitudinal direction x and the transversal direction y. The area in which the electrode fingers of opposite electrodes overlap is called the acoustically active region AAR. The bus bars are oriented parallel to the longitudinal direction x. The electrode fingers EF are oriented parallel to the transversal direction y.

When an RF signal is applied to the bus bars and the bus bars have opposite polarities, an acoustic wave is excited in the piezoelectric substrate SU.

Figure 4:
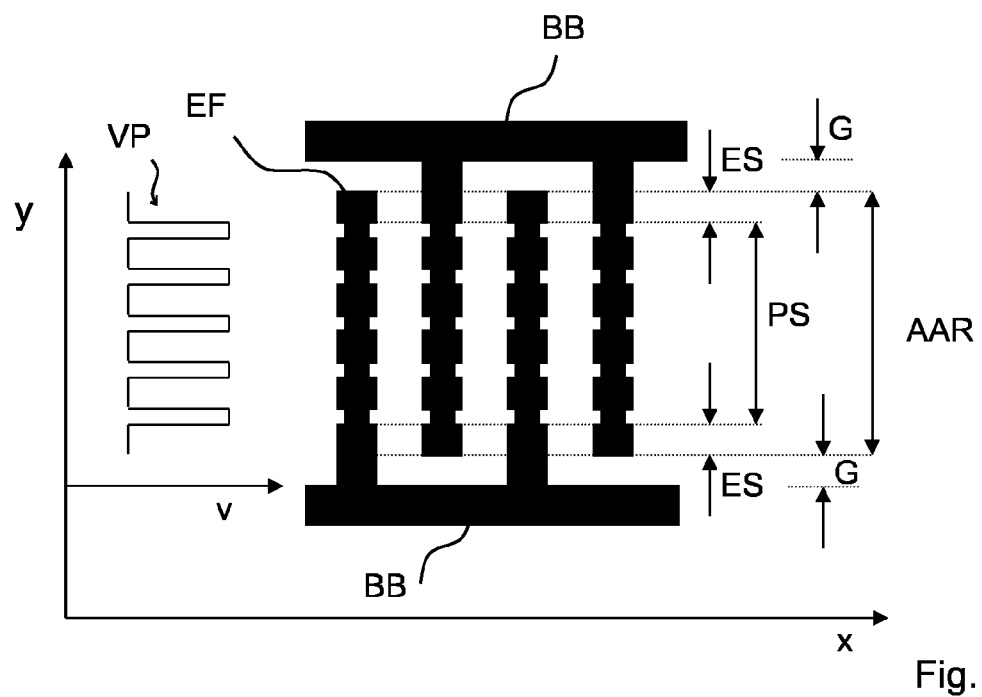
FIG. 4 illustrates a possible causal connection between the velocity profile and a physical realization of the transducer's electrode structure.

FIG. 4 shows the connection of the electrode structure and the velocity profile v. The velocity of acoustic waves at the surface or an interface of a piezoelectric material depends on the mass loading at the interface. A higher mass loading and/or a higher reflection decreases the velocity. However, higher elastic constants of a material deposited on the piezoelectric material increases the velocity. Thus, the shape of the velocity profile v along the transversal direction y can directly depend on geometric structures of the material arranged on the piezoelectric substrate, e.g. the electrode structures comprising the bus bars BB and the electrode fingers EF. To obtain the periodic structure of the velocity profile VP, the electrode fingers EF may have a shape with a corresponding periodic symmetry. To obtain minima in the velocity profile, the local finger width can be increased compared to sections where the velocity should be maximal and the according finger width is, thus, reduced. Further, in order to obtain the edge structure with a reduced velocity compared to the maximal velocity within the periodic structure, the finger width can be larger in the area corresponding to the edge structure compared to the area corresponding to the highest velocities in the periodic structure.

Figure 5:
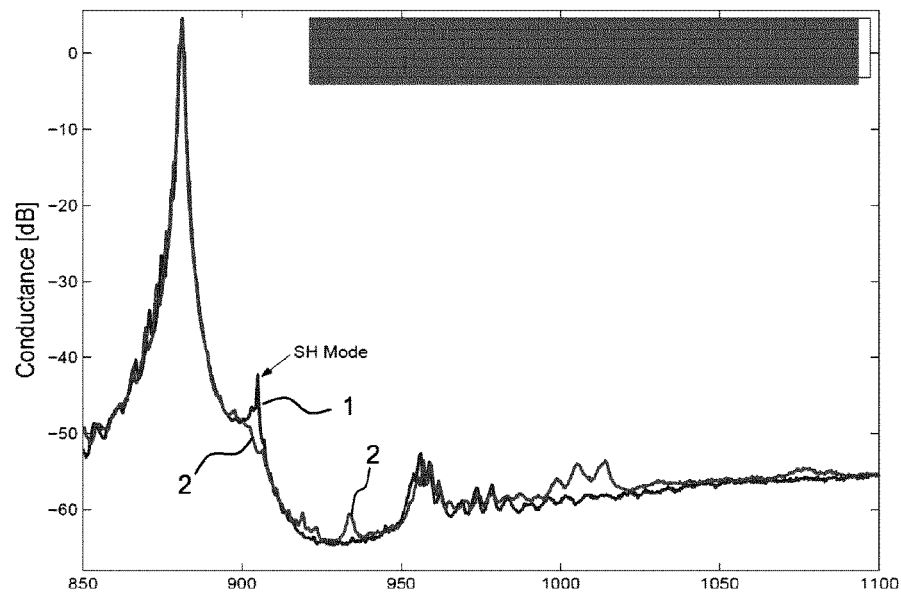
FIG. 5 shows the conductance of the transducer as described above compared to the conductance of conventional transducers.

FIG. 5 shows the conductance curves of two transducers. The frequency-dependent conductance of a conventional transducer is denoted as "1" while the conductance of an improved transducer is denoted as "2". Especially at a frequency of approximately 910 MHz, the conventional transducer offers a peak deriving from the SH mode. A resonance in the improved transducer is efficiently suppressed.

Figure 6:
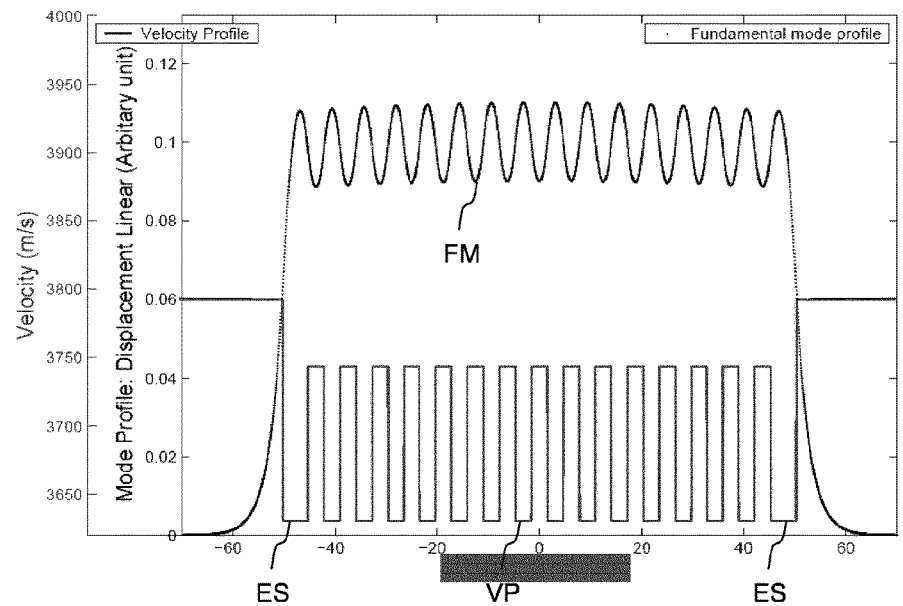
FIG. 6 shows the velocity profile and the profile of the fundamental mode of the improved transducer the conductance of which is shown in FIG. 5.

The transducer, of which the frequency-dependent conductance is shown in FIG. 5, has a velocity profile shown in FIG. 6. The velocity profile VP has a periodic structure between two structures deviating from the periodic structure, namely the edge structure ES. In the velocity profile VP shown in FIG. 6, the fundamental mode FM is formed. The combination of the periodic structure and the edge structure ES allows to efficiently suppress the SH mode while also no or nearly no transversal modes are excited.

Figure 7:
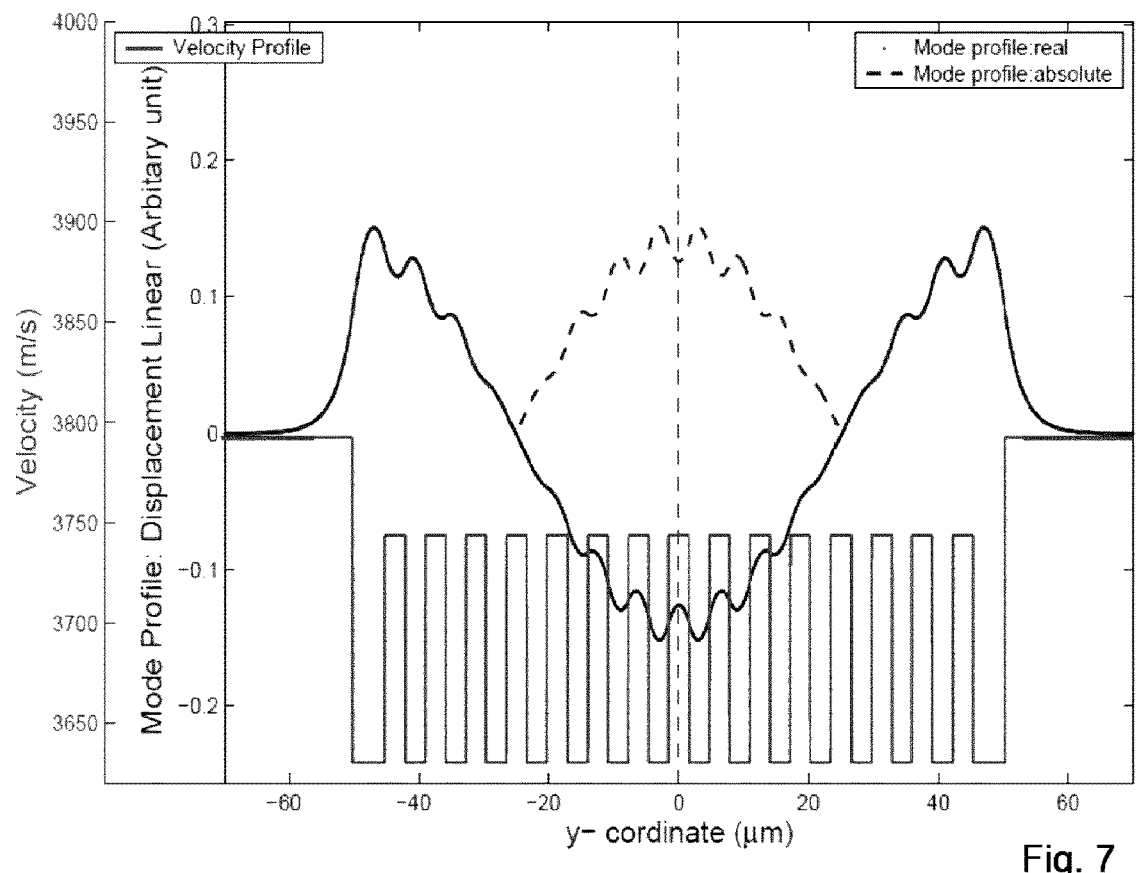
FIG. 7 shows the velocity profile of the second symmetric wave mode of an embodiment of the transducer together with the mode profile and the absolute value of the mode profile.

FIG. 7 shows a velocity profile and the corresponding symmetric wave mode profile together with its absolute value. As can be seen, the amplitude of the mode profile with a positive displacement is mainly equal to the amplitude of the mode profile with a negative displacement in the periodic structure. Thus, the areas of positive and negative displacements, i.e. the value of the integral of the mode profile mainly vanishes and the excitation strength of the second symmetric mode is minimized.

Figure 8:
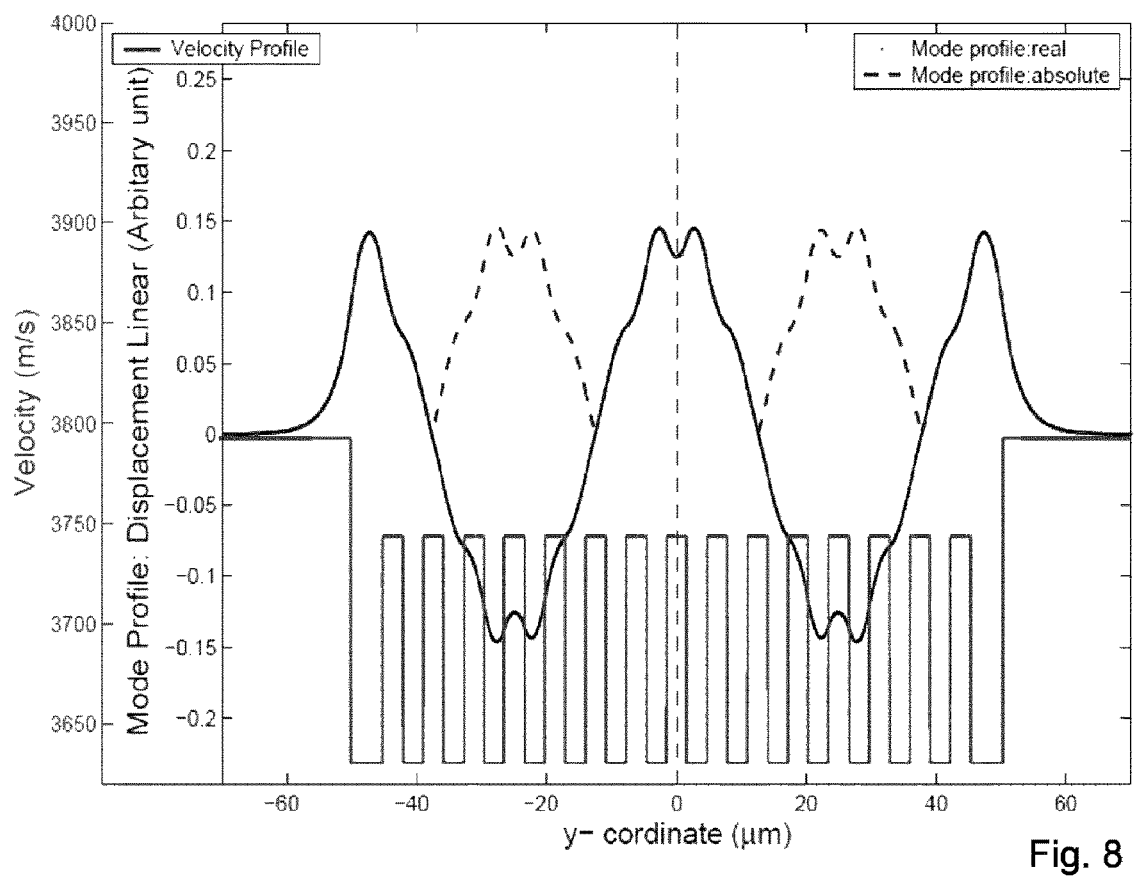
FIG. 8 shows the velocity profile and the respective mode profile and its absolute value of the third symmetric wave mode.

FIG. 8 shows, similar to the situation shown in FIG. 7, the mode profile and its absolute value of the velocity profile already shown in FIG. 7. Again, the amplitude of positive and negative displacements are mainly equal. Thus, the excitation strength of the third symmetric mode profile is minimized.

Figure 9:
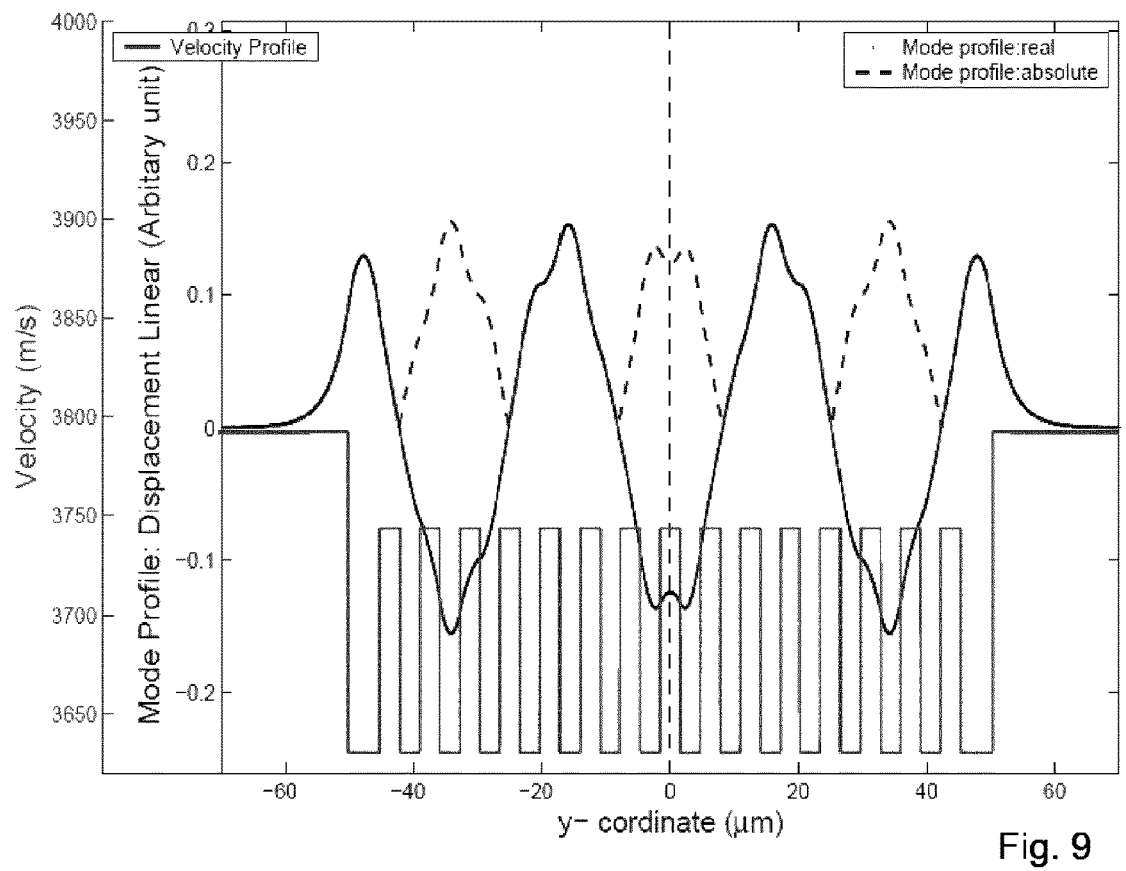
FIG. 9 shows the velocity profile and the respective mode profile and its absolute value of the fourth symmetric wave mode.

FIG. 9 shows the mode profile of the fourth symmetric wave mode. Again, the amplitude of positive and negative displacements are mainly equal. Thus, the excitation strength of the fourth symmetric wave mode is minimized.

Figure 10:
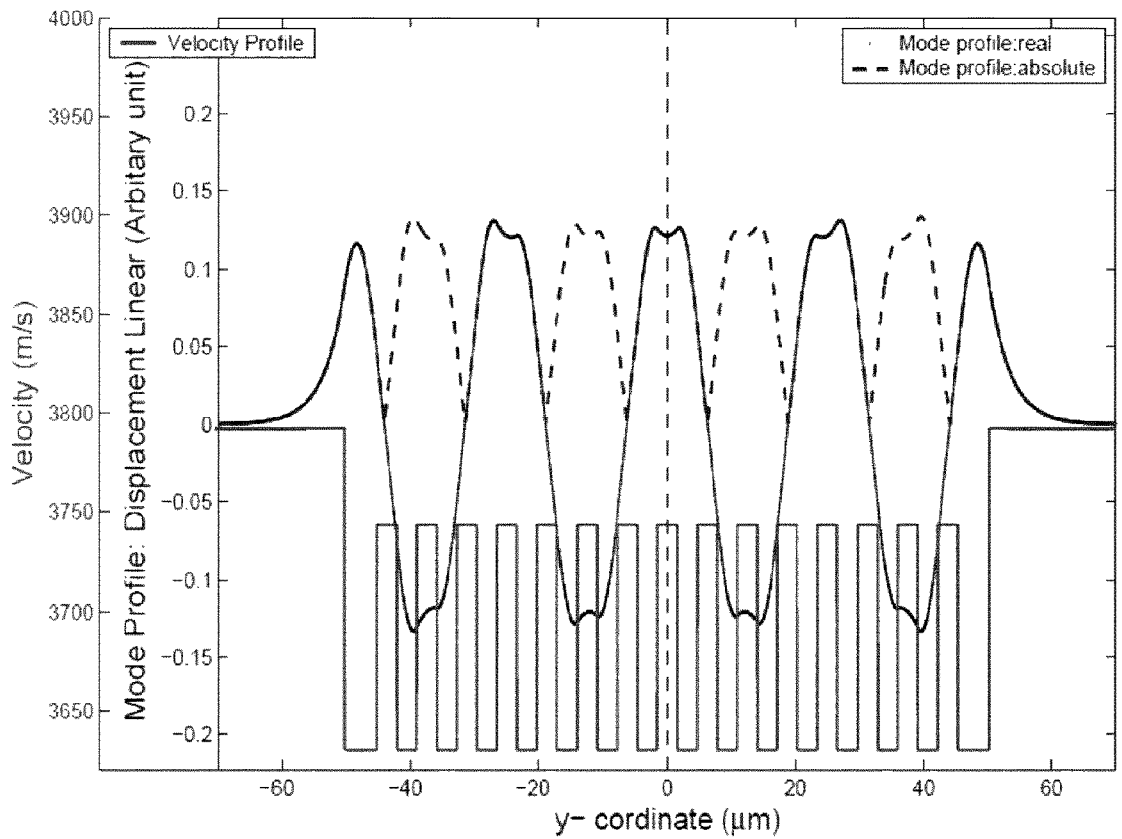
FIG. 10 shows the velocity profile and the mode profile and its respective absolute value of the fifth symmetric wave mode.

FIG. 10 shows the mode profile and its absolute value of the fifth symmetric wave mode. Again, the excitation strength is minimized as the shape of the velocity structure with the edge structure flanking the periodic structure is an efficient means to suppress higher order modes.

Figure 11:
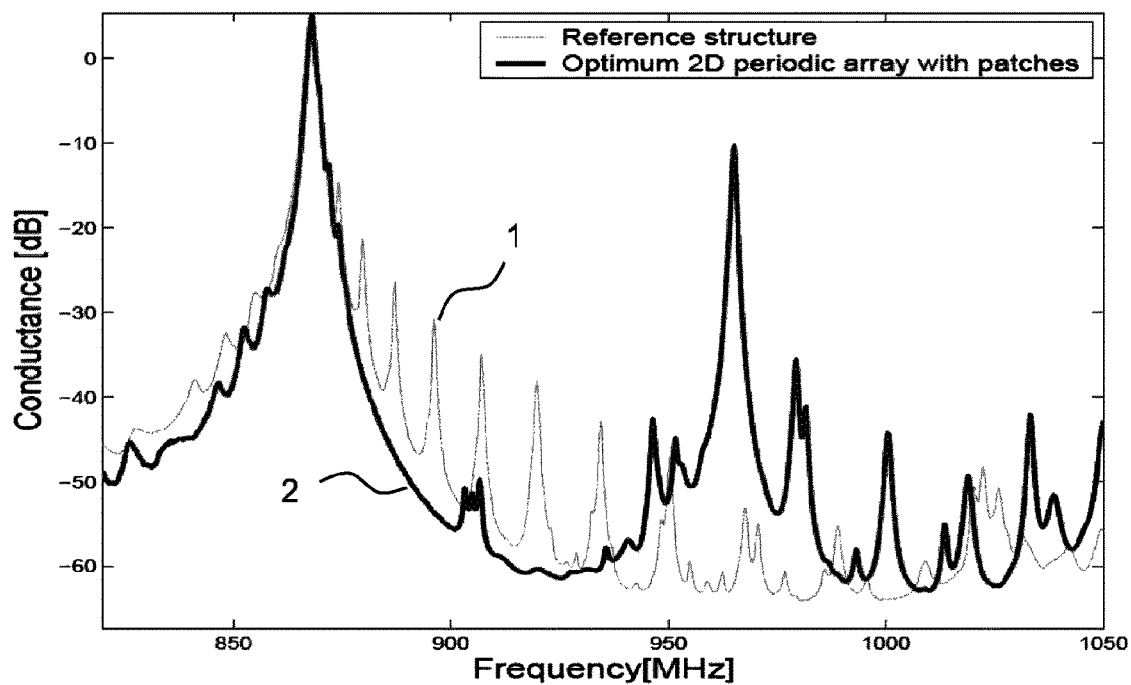
FIG. 11 shows the frequency-dependent conductance of a transducer with a 2D periodic array with patches compared to the conductance of a conventional transducer.
Figure 12:
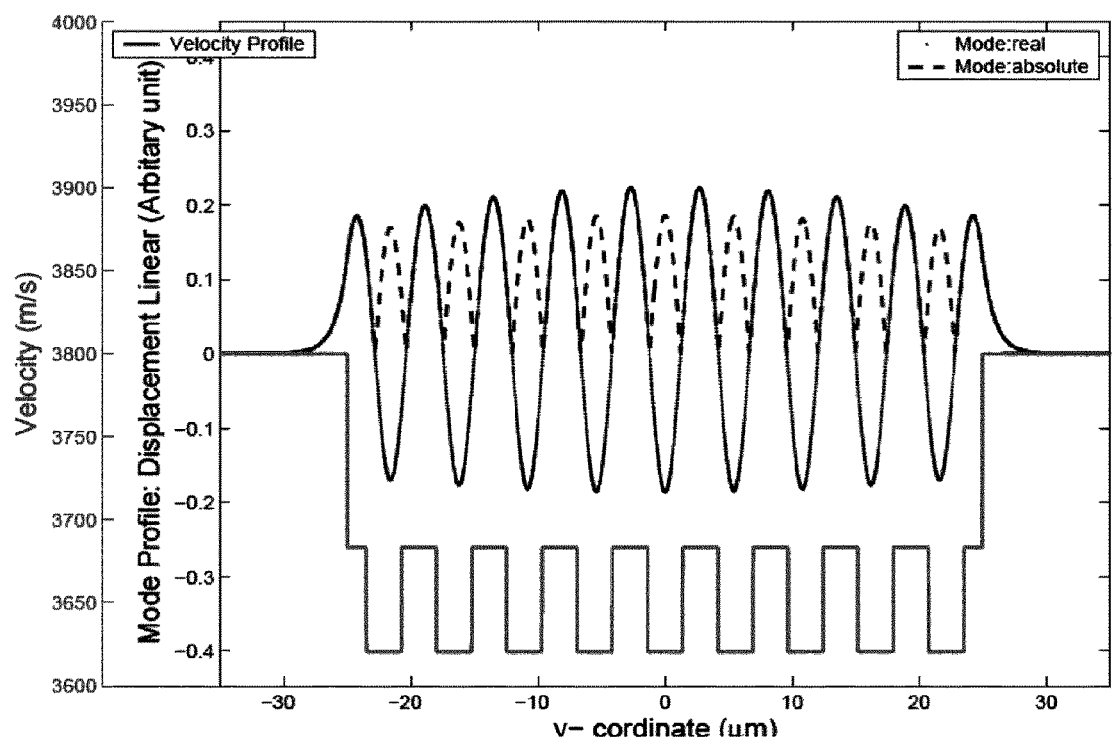
FIG. 12 shows the velocity profile and the wave mode and its respective absolute value of the transducer having the frequency characteristic shown in FIG. 11.

FIG. 11 shows conductance curves of a conventional transducer, curve "1" and of a transducer where the velocity in the edge structure is equal to the highest velocity in the periodic structure, curve "2". Further, the velocity in the periodic structure or in the active region (the velocity profile is shown in FIG. 12) is very slow so that the transversal mode, of which the wavelength is equal or similar to the transversal periodicity, is bound. As a result, a plurality of resonances in the frequency-dependent conductance—as shown by curve 2—are obtained.

FIG. 12 shows the velocity profile corresponding to conductance curve 2 of FIG. 11. Since the transversal mode is bounded, the shape of the mode profile becomes cosine-like. A comparison between the mode profile shown in FIG. 12 and the absolute value of the mode profile reveals that the negative displacement has a smaller amplitude than the positive displacement. As a result, the signal is not cancelled out completely and the plurality of resonances shown in FIG. 11 are obtained.

Thus, the depth of the velocity profile should not exceed critical values. The waveguide parameters have to be chosen in such a way that the highest bounded mode has a lower number than the mode responsible for the second resonances as shown in curve 2 of FIG. 11.

The highest bounded mode—denoted as $n_{max}$—that a wave guide can contain is a function of the aperture and the track and gap velocity:

$$n_{max} = 2Af_0 \text{sqrt}[1/(v_{track})^2 - 1/(v_{gap})^2]$$

Here, A denotes the aperture. $f_0$ denotes the resonance frequency. $V_{track}$ is the lowest velocity in the active region. $V_{gap}$ is the velocity in the gap structure.

FIG. 13 shows a basic embodiment where the periodic structure of the velocity profile is obtained by an according periodic finger width variation in the electrodes.

FIG. 14 is an embodiment of a transducer where a reduced velocity in the gap structure is obtained by an increase of the finger width of the electrodes in the area corresponding to the gap structure.

FIG. 15 shows an embodiment of a transducer structure where the velocity in the gap structure is increased by a reduced finger width in the corresponding section of the electrodes.

FIG. 16 shows an embodiment where mass loading is increased to reduce the velocity in the gap structure by additional dummy fingers arranged in such a way that the distance between the bus bar and an electrode finger is reduced to a minimum.

FIG. 17 shows an embodiment of a transducer where a dielectric material, e.g. comprising a silicon dioxide, is arranged in two stripes in the gap structure corresponding region.

FIG. 18 shows an embodiment of a transducer where the electrode fingers are covered with a dielectric material, e.g. silicon dioxide as a TCF-compensation layer. The left part of FIG. 18 shows a top view onto the transducer where two stripes of metal increase the mass loading to reduce the velocity in the gap structure corresponding region. The right part of FIG. 18 shows a cross-section through the transducer showing that the dielectric material is arranged between the metal stripes and the electrodes.

As a dielectric material DS is arranged between the electrode fingers EF and the stripes for increased mass loading MS, the stripes MS can comprise a metal. This is in contrast to FIG. 17 where the stripes are directly arranged on the electrode fingers. Thus, an insulating material is preferred in the embodiment shown in FIG. 17.

FIG. 19 shows on the left-hand side a top view onto a transducer structure and the thickness of the respective metallization of the electrode fingers along the transversal direction (right-hand side). In the active region, the thickness of the metallization is reduced. In the region corresponding to the gap structure, the thickness is larger than in the active region. Thus, a velocity profile in which the velocity in the gap structure is reduced compared to the periodic structure is obtained.

FIG. 20 shows an embodiment of a transducer where the transducer structure is covered with a dielectric material DM. In order to increase the mass loading, individual segments of a material with a high density, e.g. a metal, are arranged on the respective electrode fingers of the edge structure. As the additional material is arranged directly on the electrode material and not isolated from the electrodes via the dielectric material DM, the segments of the additional material should not be in direct contact with each other.

Figure 21:
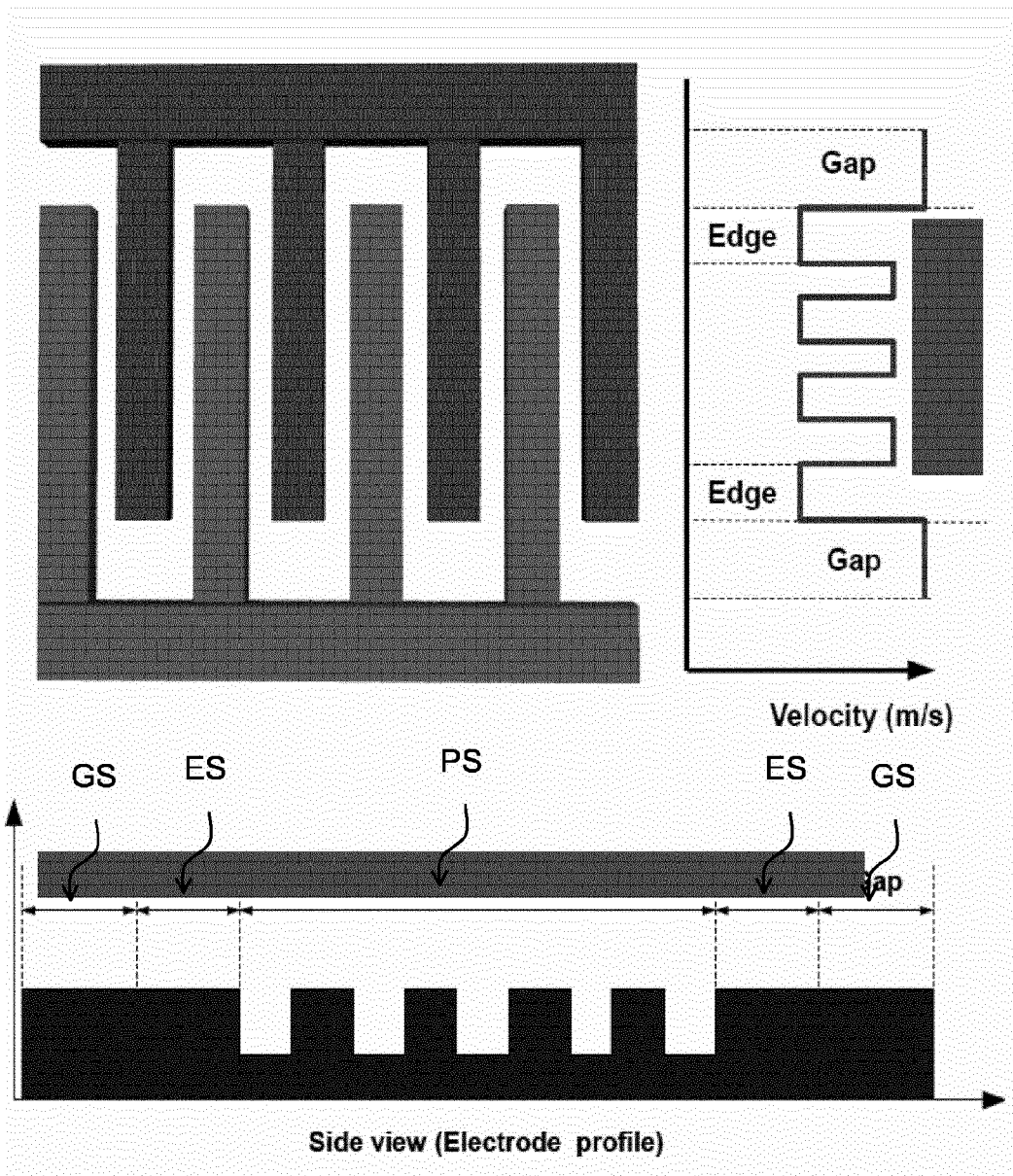
FIG. 21 shows electrode structures the material of which is partially removed to obtain the respective velocity profile.

FIG. 21 shows an important aspect in forming the velocity profile shown in the upper right part of FIG. 21: The lower part of FIG. 21 shows that the height of the metallization establishing the electrode fingers can be varied along the transversal direction to adjust the velocity profile. A periodic profile can be etched into the electrode finger to obtain the periodic structure PS. The thicknesses in the regions corresponding to the edge structures and the gap structures can be adjusted accordingly.

Figure 22:
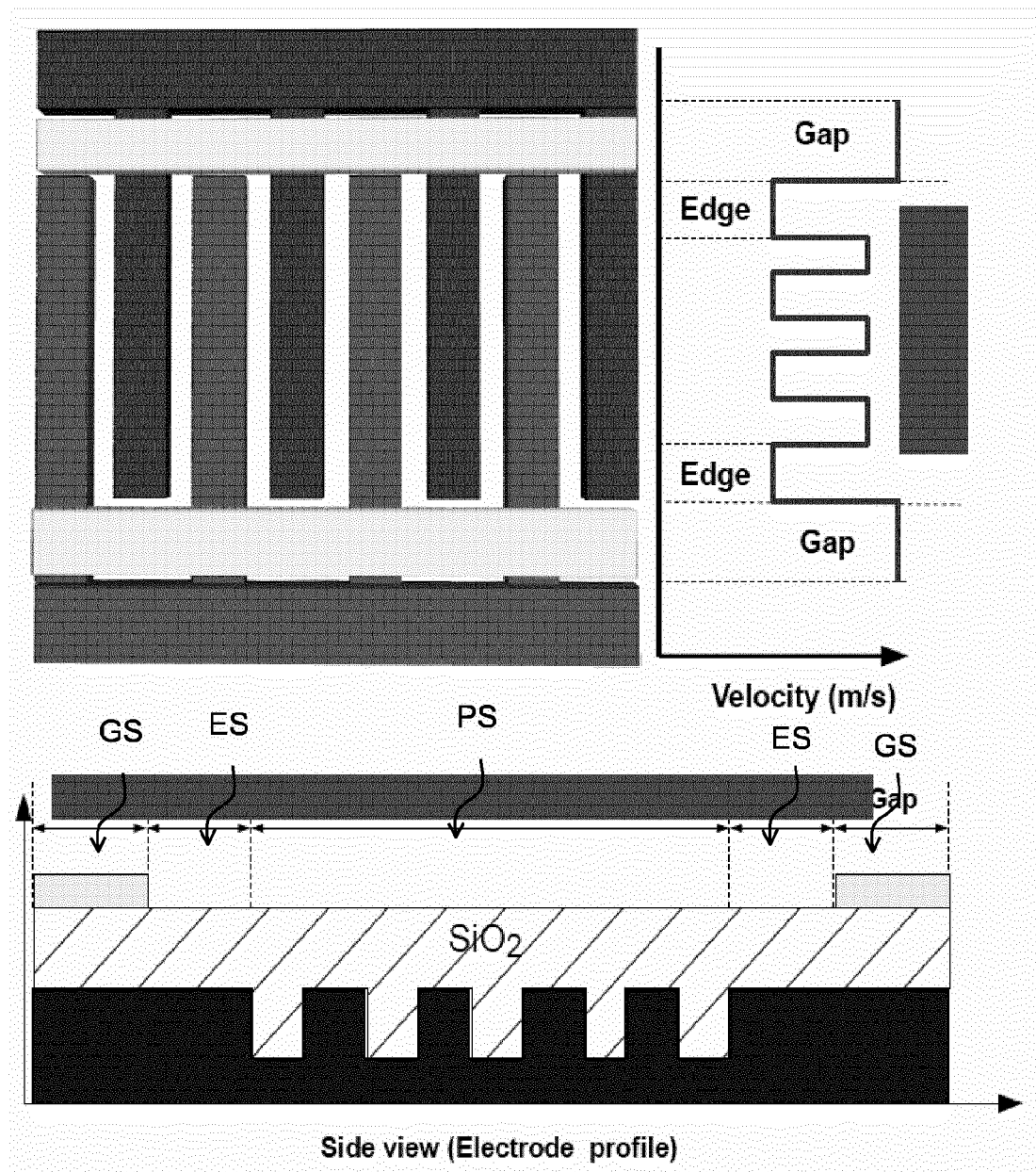
FIG. 22 shows an embodiment of electrode structures with additional material deposited on locally etched electrode structures.

FIG. 22 shows a further embodiment of the transducer shown in FIG. 21 where further to the etching to obtain different thicknesses in the electrode structure, a dielectric, e.g. a silicon dioxide, is arranged on the electrode structures. Further, another material is deposited in stripes in the gap regions to adjust the velocity profile.

Figure 23:
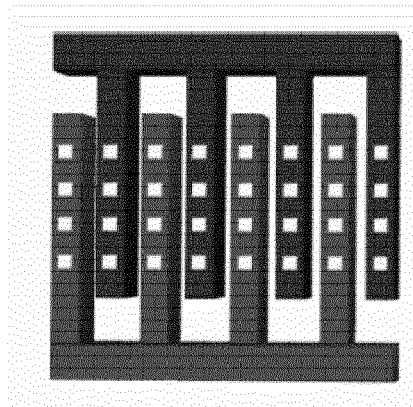
FIG. 23 shows electrode fingers with recesses.

FIG. 23 shows an embodiment where recesses are structured into the electrode fingers to provide a physical basis for the periodic structure of the velocity profile.

Figure 24:
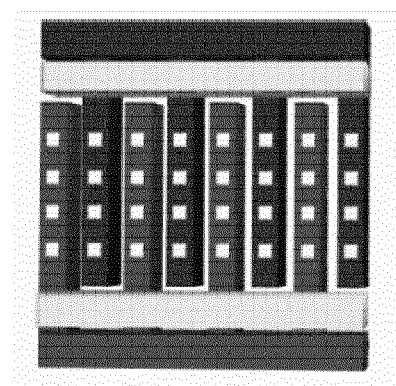
FIG. 24 shows electrode structures with additional metal bars in the region correlated to the gap structure and with recesses in the electrode fingers establishing the periodic structure.

FIG. 24 shows further to the recesses of FIG. 23 in the electrode fingers material bars, e.g. metal bars, in the areas corresponding to the gap structure as a physical realization of the velocity setting.

Figure 25:
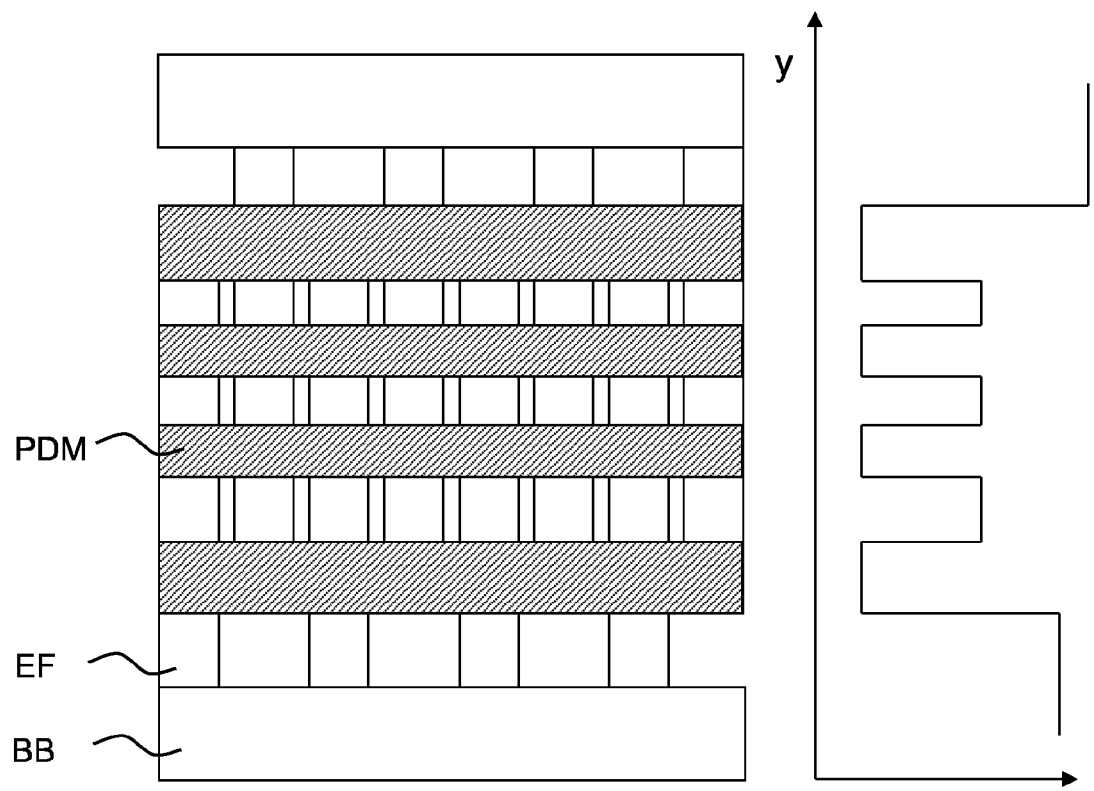
FIG. 25 shows stripes of a periodic dielectric material arranged on interdigitated electrode fingers and between the fingers and extending along the longitudinal direction.

FIG. 25 shows a possible arrangement of periodic stripes consisting of the periodic dielectric material PDM. The right portion of FIG. 25 illustrates the effect of the dielectric material PDM on the transversal velocity profile. At segments of the electrode fingers EF with the material PDM and at segments between the fingers the mass loading is increased and the velocity is accordingly reduced.

Figure 26:
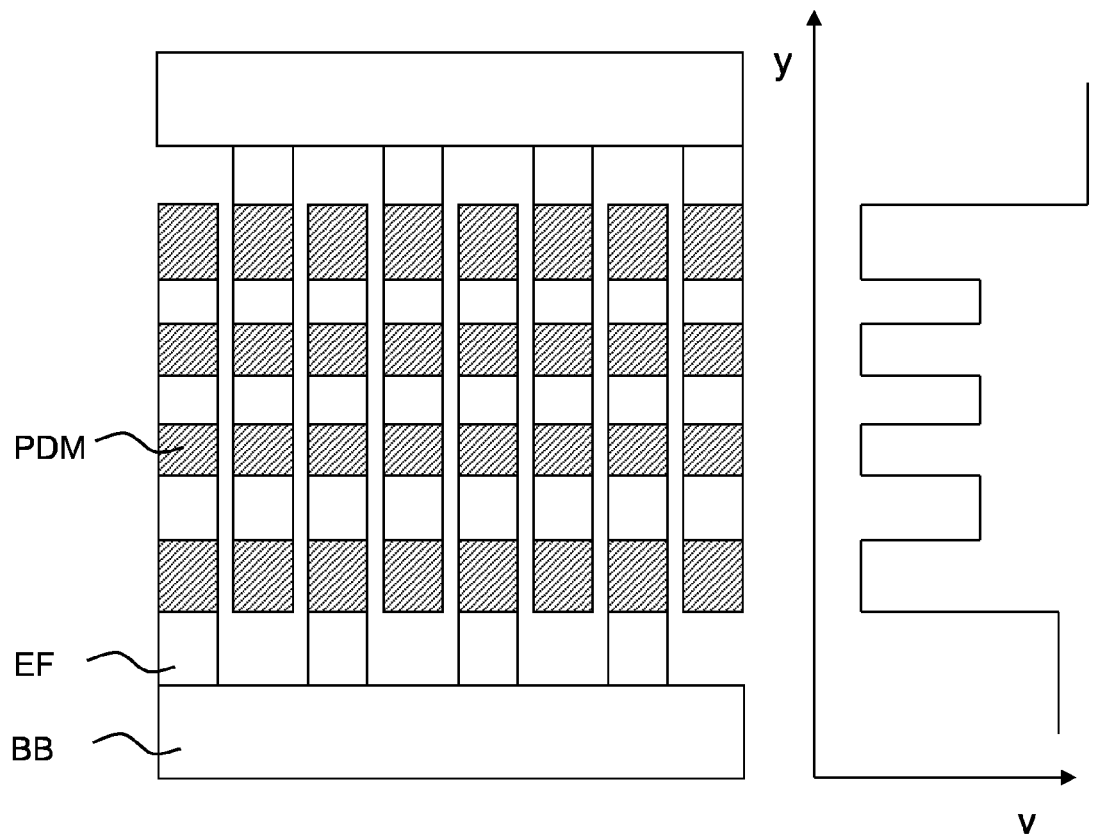
FIG. 26 shows stripes of a periodic dielectric material arranged on interdigitated electrode fingers.

FIG. 26 shows a possible arrangement of periodic stripes consisting of the periodic dielectric material PDM. Again, the right portion of FIG. 26 illustrates the effect of the dielectric material PDM on the transversal velocity profile. At segments of the electrode fingers EF with the material PDM the mass loading is increased and the velocity is accordingly reduced. The area between the fingers is free from the periodic dielectric material.

Figure 27:
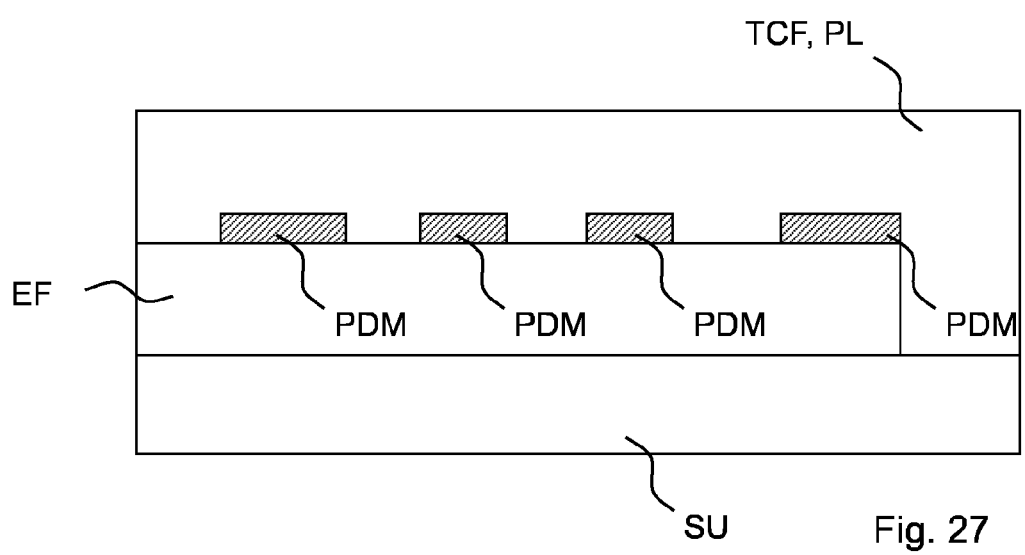
FIG. 27 shows a cross section of a transducer with stripes according to FIG. 25.

FIG. 27 shows a cross section of the transducer of FIG. 25. The mass loading is obtained by arranging the stripes of the dielectric material PDM having a higher density than its surrounding, in particular the material deposited on the electrode fingers which may be a material of a TCF-compensation layer TCF compensating different temperature coefficients or of a passivation layer PL.

Figure 28:
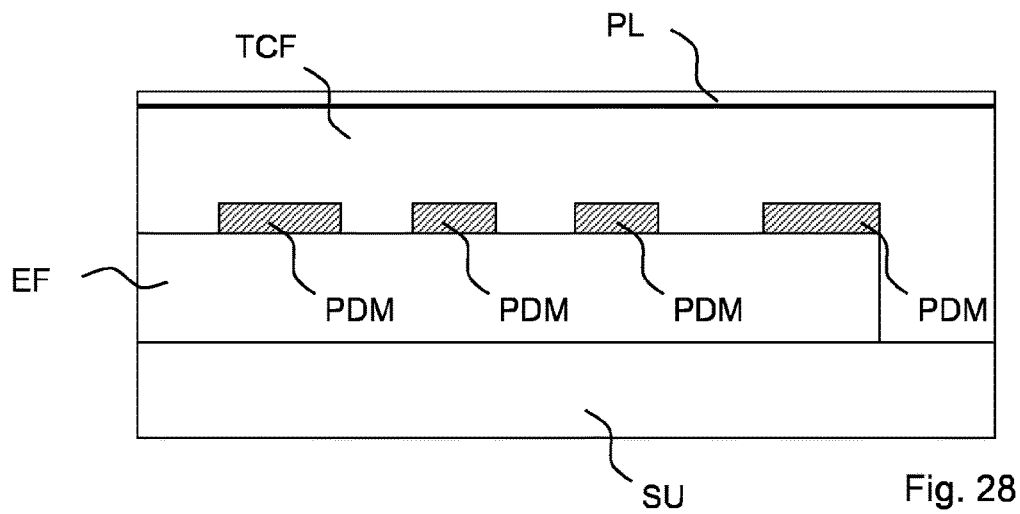
FIG. 28 shows a cross section of a transducer with a TCF-compensation layer and a passivation layer.

FIG. 28 shows a cross section of a transducer with a TCF-compensation layer and a passivation layer on the TCF-compensation layer.

Figure 29:
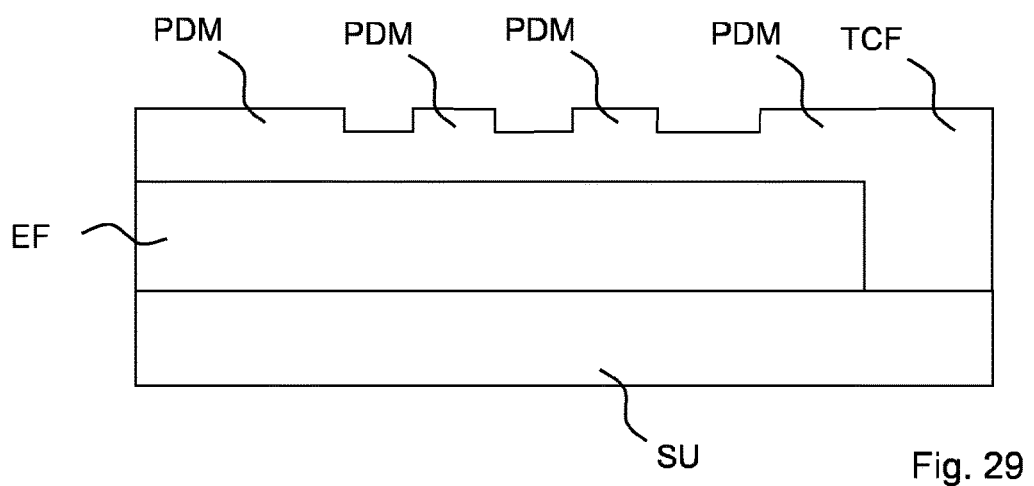
FIG. 29 shows a cross section of a transducer with a structured TCF-compensation layer.

FIG. 29 shows a cross section of a transducer with a structured TCF-compensation layer. A periodic transversal pattern is structured into the compensation layer to support the formation of the velocity profile's periodic shape.

Figure 30:
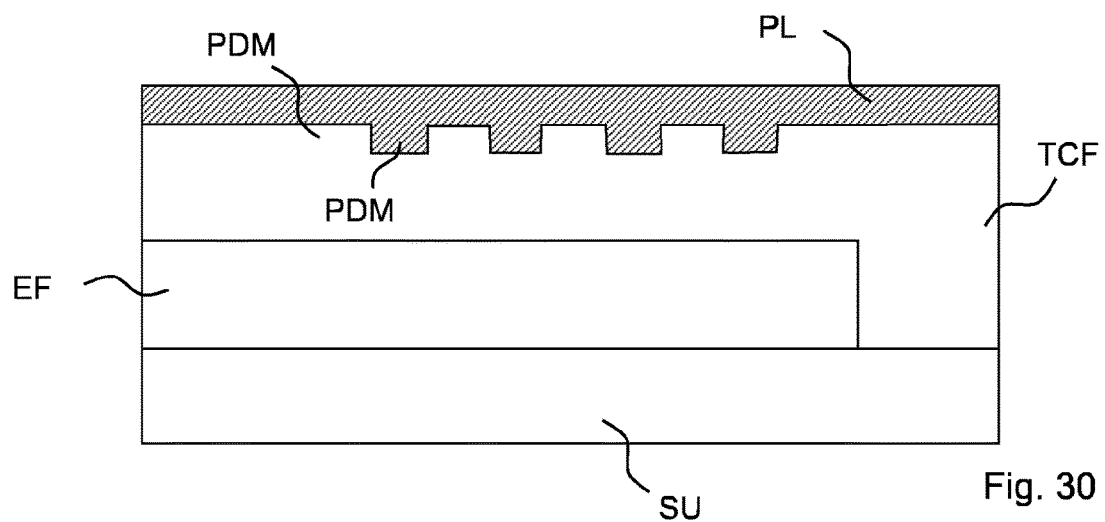
FIG. 30 shows a cross section of a transducer with a structured TCF-compensation layer covered by a passivation layer with a flat surface.

FIG. 30 shows a cross section of a transducer with a structured TCF-compensation layer covered by a passivation layer with a flat surface. Although the transducer does not reveal a periodic transversal pattern at its surface, the periodic pattern structured in the TCF-compensation layer TCF and—as a negative pattern—at the bottom side of the passivation layer PL helps forming the velocity profile VP if the material of the TCF-compensation layer and of the passivation layer have different stiffness or density values.

Figure 31:
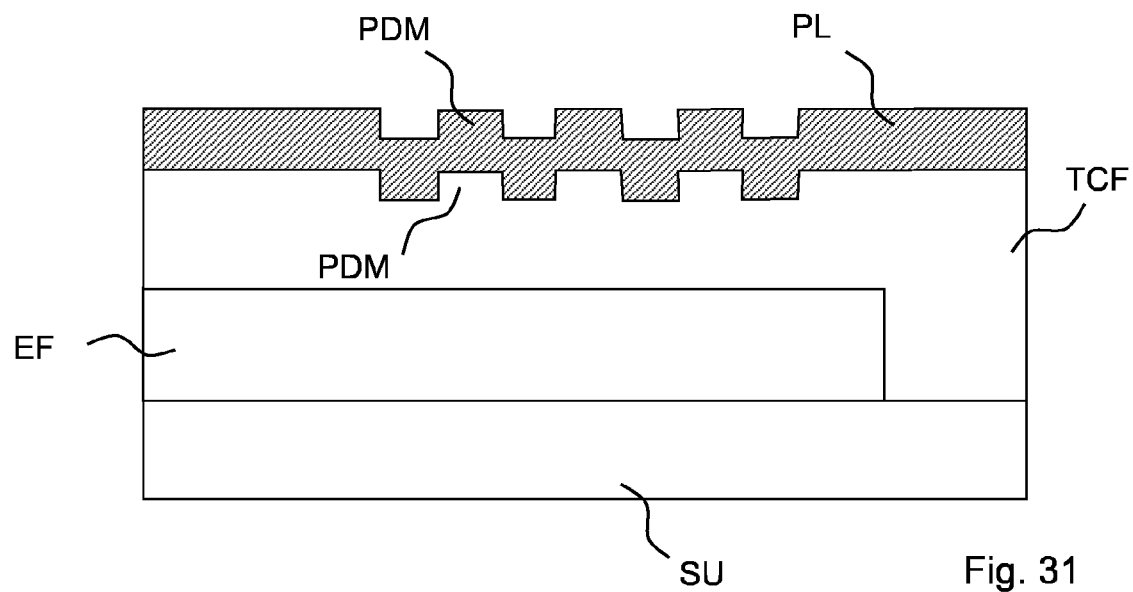
FIG. 31 shows a cross section of a transducer with a structured TCF-compensation layer covered by a passivation layer following the structure of the TCF-compensation layer.

FIG. 31 shows a cross section of a transducer with a structured TCF-compensation layer TCF covered by a passivation layer PL. The passivation layer PL mainly has a constant thickness. Thus, its surface follows the structure of the TCF-compensation layer.

Figure 32:
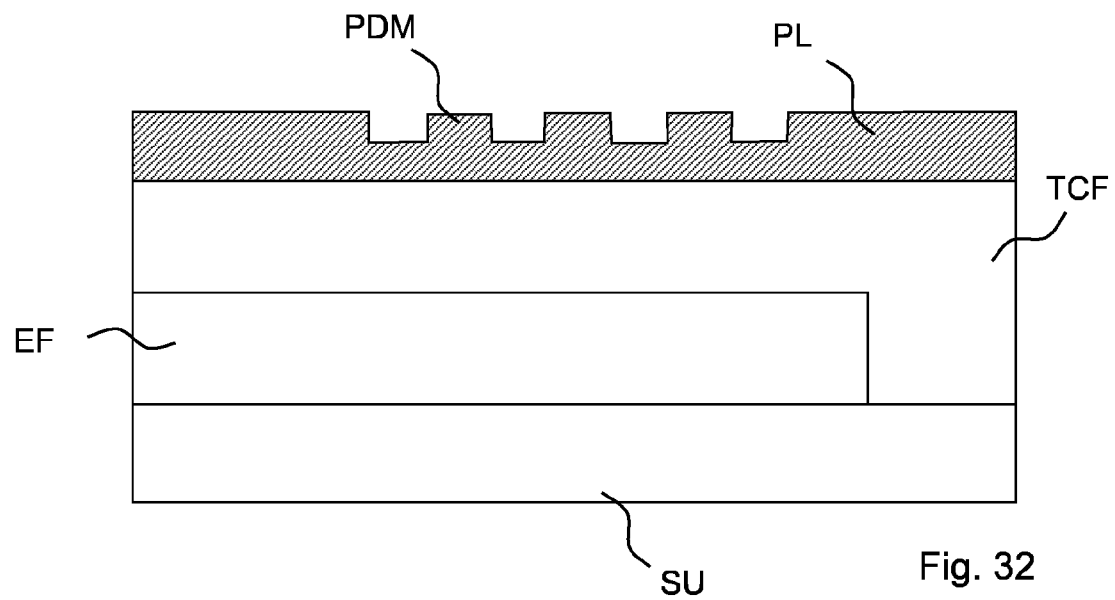
FIG. 32 shows a cross section of a transducer with a TCF-compensation layer covered by a structured passivation layer.

FIG. 32 shows a cross section of a transducer with a TCF-compensation layer covered by a structured passivation layer comprising the periodic pattern needed to support the formation of the velocity profile.

LIST OF REFERENCE SYMBOLS 1, 2: frequency-dependent conductance of a transducer
AAR: acoustically active region
BB: bus bar
DM: dielectric material
DS: dielectric stripe
EF: electrode finger
ES: edge structure
FM: frequency modulation
G: gap
GS: gap structure
MS: metallic stripe
PDM: periodic dielectric material
PL: passivation layer
PS: periodic structure
SU: substrate
TCF: TCF compensation layer
TD: transducer
v: velocity
VP: velocity profile
x: longitudinal direction
y: transversal direction

The invention claimed is:

1. An electroacoustic transducer, comprising:
an acoustically active region with interdigitating electrode fingers; and
a periodic dielectric material having a periodic structure in the acoustically active region along a transversal direction of the transducer that is orthogonal to a longitudinal direction, the periodic dielectric material comprising at least three strips of dielectric material in the acoustically active region arranged periodically along the transversal direction, wherein:
a transversal velocity profile of acoustic waves propagating in the transducer has a periodic structure in the acoustically active region; and
the periodic structure of the transversal velocity profile is flanked on both sides by an edge structure of the transversal velocity profile.

2. The transducer of claim 1, wherein a piezoelectric material of the transducer is quartz.

3. The transducer of claim 1, further comprising dummy fingers.

4. The transducer of claim 1, wherein a shape of the periodic dielectric material coincides with the periodic structure (PS) of the velocity profile of the transducer.

5. The transducer of claim 1, wherein the periodic dielectric material comprises:
structured material from a passivation layer; or
structured material from a temperature coefficient of frequency (TCF)-compensation layer.

6. The transducer of claim 1, wherein the periodic dielectric material is arranged:
directly on the interdigitating electrode fingers;
in a passivation layer deposited above the interdigitating electrode fingers;
in a TCF-compensation layer deposited above the interdigitating electrode fingers; or
on a top side of the transducer.

7. The transducer of claim 1, wherein the strips of the dielectric material are arranged on the electrode fingers.

8. The transducer of claim 1, wherein the strips of the dielectric material are arranged above the electrode fingers.

9. The transducer of claim 1, wherein the strips of the dielectric material are arranged between the electrode fingers or elevated over regions between the electrode fingers.

10. The transducer of claim 1, wherein the strips of the dielectric material extend along the longitudinal direction.

11. The transducer of claim 1, wherein the periodic dielectric material has:
a density different from a density of dielectric material surrounding the periodic dielectric material; or
a stiffness different from a stiffness of dielectric material surrounding the periodic dielectric material.

12. The transducer of claim 1, wherein the edge structure comprises two strips arranged directly next to a respective side of the periodic structure.

13. The transducer of claim 1, further comprising two strips of a gap structure configured such that:
- in the gap structure, an acoustic velocity associated with the transducer is larger in the gap structure than a maximal velocity value of the transversal velocity profile of the periodic structure; and
- the acoustically active region is arranged between the two strips of the gap structure.

14. The transducer of claim 13, wherein the strips of the gap structure have a length that is between half an acoustic wavelength in the longitudinal direction to ten times the acoustic wavelength.

15. The transducer of claim 13, wherein the gap structure has a metallization ratio from 0.2 to 0.8.

16. The transducer of claim 1, further comprising:
- a piezoelectric substrate; and
- two busbars arranged on the piezoelectric substrate and aligned parallel to the longitudinal direction, wherein each of the interdigitated electrode fingers is arranged on the piezoelectric substrate, connected to one of the busbars, and aligned parallel to the transversal direction.

17. The transducer of claim 1, wherein a velocity of the transversal velocity profile in the edge structure is lower than a maximal velocity value of the periodic structure of the transversal velocity profile, and wherein a piezoelectric material of the transducer is lithium niobate ($LiNbO_3$).

18. The transducer of claim 1, wherein a velocity of the transversal velocity profile in the edge structure is higher than a minimal velocity value of the periodic structure of the transversal velocity profile, and wherein a piezoelectric material of the transducer is lithium tantalate ($LiTaO_3$).

* * * * *